(12) United States Patent
Sand et al.

(10) Patent No.: US 7,611,919 B2
(45) Date of Patent: Nov. 3, 2009

(54) BONDING INTERFACE FOR MICRO-DEVICE PACKAGING

(75) Inventors: Kirby Sand, Corvallis, OR (US); Charles C. Haluzak, Corvallis, OR (US); Chien-Hua Chen, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 531 days.

(21) Appl. No.: 11/112,406

(22) Filed: Apr. 21, 2005

(65) Prior Publication Data

US 2006/0237810 A1 Oct. 26, 2006

(51) Int. Cl.
*H01L 21/00* (2006.01)
(52) U.S. Cl. .................. 438/51; 257/E21.499
(58) Field of Classification Search ........... 438/106, 438/FOR. 455, 55, 25, 38, 50, 51, 52; 257/E21.499, 257/E23.118, E23.193, E23.137
See application file for complete search history.

(56) References Cited

U.S. PATENT DOCUMENTS

| | | | | |
|---|---|---|---|---|
| 5,134,086 A * | 7/1992 | Ahn | ............................ | 438/398 |
| 5,610,431 A * | 3/1997 | Martin | ........................ | 257/415 |
| 6,448,109 B1 * | 9/2002 | Karpman | ..................... | 438/108 |
| 6,450,029 B1 * | 9/2002 | Sakai et al. | .................... | 73/488 |
| 6,660,564 B2 * | 12/2003 | Brady | ......................... | 438/119 |
| 6,806,557 B2 * | 10/2004 | Ding | ........................... | 257/659 |
| 6,955,934 B2 * | 10/2005 | Gallup et al. | ................. | 438/27 |
| 7,005,732 B2 * | 2/2006 | Horning et al. | .............. | 257/678 |
| 2002/0000646 A1 * | 1/2002 | Gooch et al. | ................ | 257/666 |
| 2002/0171106 A1 * | 11/2002 | Hovel et al. | .................. | 257/347 |
| 2003/0063762 A1 * | 4/2003 | Tajima et al. | ................ | 381/111 |
| 2003/0110864 A1 * | 6/2003 | Vujanic et al. | ................. | 73/716 |
| 2003/0219540 A1 * | 11/2003 | Law et al. | ................. | 427/376.2 |
| 2004/0060898 A1 * | 4/2004 | Tsai | ................................ | 216/2 |
| 2004/0077117 A1 * | 4/2004 | Ding et al. | .................... | 438/51 |
| 2004/0259325 A1 * | 12/2004 | Gan | ............................ | 438/456 |
| 2005/0063071 A1 * | 3/2005 | Wang et al. | .................. | 359/742 |
| 2005/0184388 A1 * | 8/2005 | Shih et al. | .................... | 257/734 |
| 2005/0206483 A1 * | 9/2005 | Pashby et al. | ................ | 333/262 |
| 2006/0163679 A1 * | 7/2006 | LaFond et al. | .............. | 257/414 |
| 2006/0194361 A1 * | 8/2006 | Heck et al. | .................... | 438/48 |
| 2006/0226524 A1 * | 10/2006 | Chen et al. | .................... | 257/680 |
| 2006/0237810 A1 * | 10/2006 | Sand et al. | .................... | 257/434 |

FOREIGN PATENT DOCUMENTS

JP 2001284250 A * 10/2001

* cited by examiner

*Primary Examiner*—W. David Coleman
*Assistant Examiner*—Latanya Crawford

(57) ABSTRACT

In one embodiment, a method for making a cover for a micro-device package includes forming a layer of silicon on a transparent substrate and selectively removing parts of the silicon layer to form a bonding ring and an alignment target.

18 Claims, 10 Drawing Sheets

BONDING INTERFACE FOR MICRO-DEVICE PACKAGING

BACKGROUND

Microelectromechanical system (MEMS) devices are used to modulate the display of color and light in digital projectors and other optical devices. Optical MEMS devices are often formed on a silicon substrate using semiconductor processing techniques and then sealed under a glass cover that allows light to reach the MEMS device. In one type of optical MEMS package, a TEOS bonding ring formed on the bottom of the glass cover bonds the cover to the MEMS device substrate to affix the cover to the underlying structure. In another type of optical MEMS package, a TEOS layer on the bottom of the glass cover bonds to a TEOS membrane formed over the MEMS device to affix the cover to the underlying structure. Some tools used in processing glass cover wafers cannot properly sense the wafers because they are transparent. Consequently, glass cover wafers must be made opaque for some processing steps. The TEOS layer used to form the bonding ring or bonding layer cannot be used to opaque the wafer because it is also transparent to these same processing tools. A thin metal layer formed on one or both sides of the wafer, therefore, is commonly used to make the wafer opaque. This metal layer, however, has no other functionality to the MEMS device package and is removed from the glass cover wafer before bonding to the MEMS structure.

DRAWINGS

DESCRIPTION

Embodiments of the present invention were developed in an effort to reduce the number of steps needed to process glass cover wafers used in the assembly of optical MEMS device packages. Exemplary embodiments of the invention will be described, therefore, with reference to packaging an optical MEMS device. Embodiments of the invention, however, are not limited to optical MEMS packages but may be used in any application or environment which might benefit from the new processing techniques. Hence, the following description should not be construed to limit the scope of the invention, which is defined in the claims that follow the description.

Figure 1:
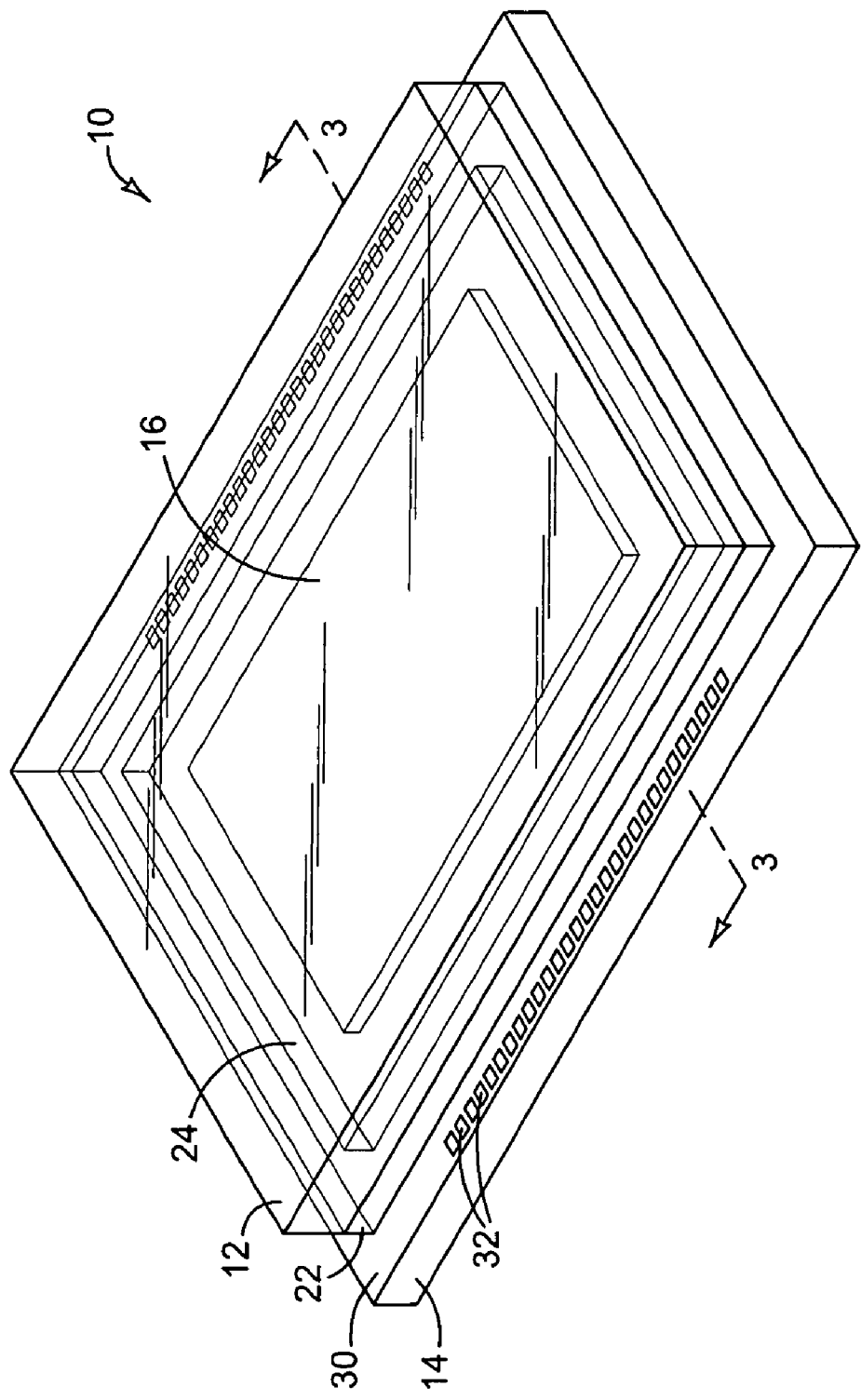
FIGS. 1 and 2 are perspective and plan views, respectively, illustrating one example of a micro-device package.
Figure 2:
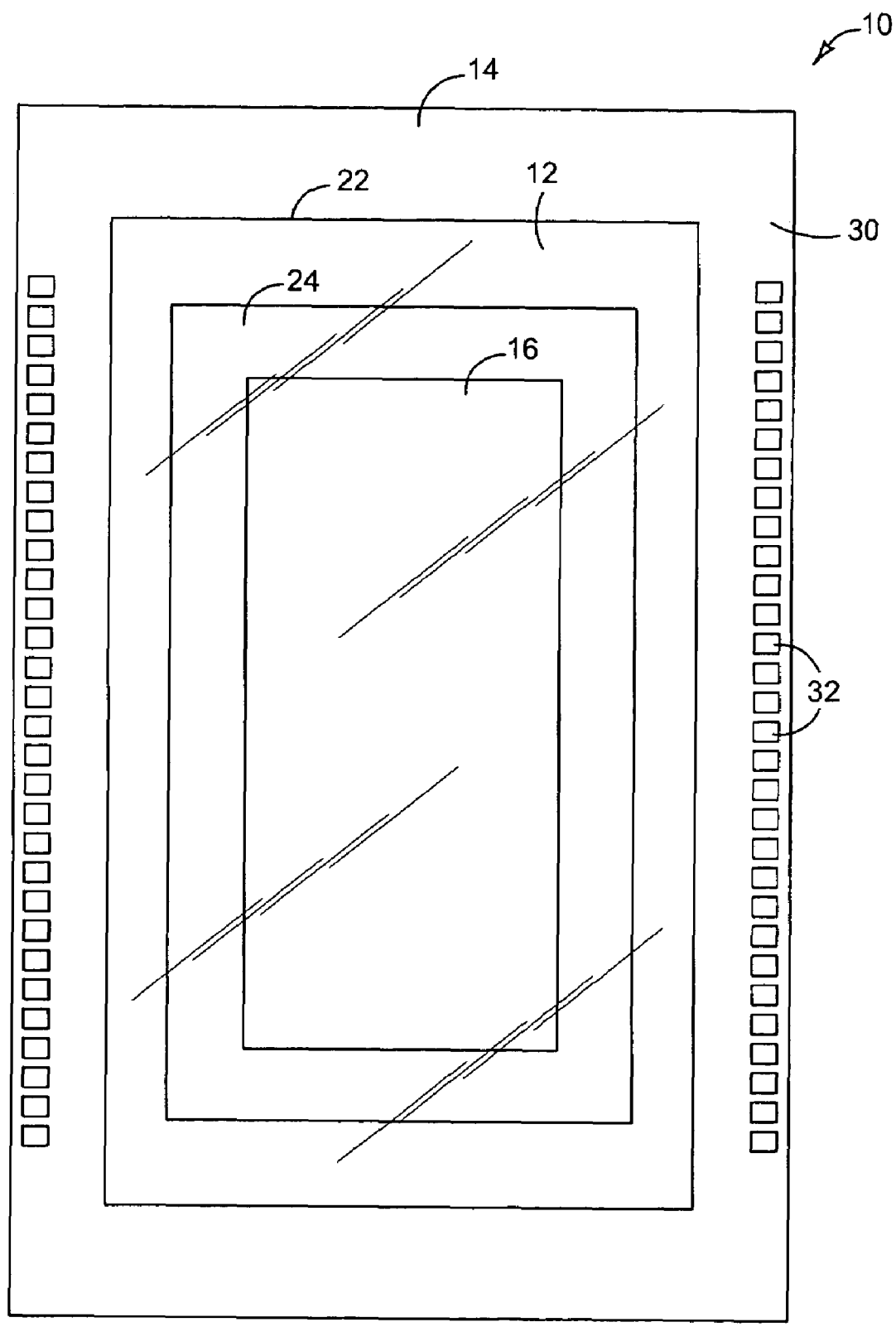
Figure 3:
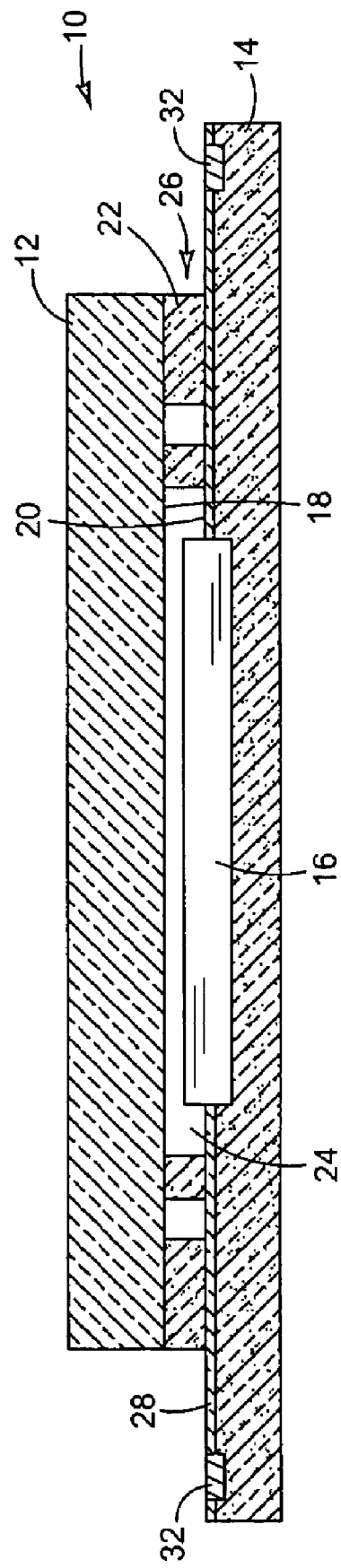
FIG. 3 is a section view taken along the lines 3-3 in FIG. 1.

FIGS. 1 and 2 illustrate a micro-device package 10. FIG. 3 is a section view of package 10 taken along the line 3-3 in FIG. 1. Referring to FIGS. 1-3, device package 10 includes a transparent cover 12, a substrate 14 and one or more micro-devices formed on substrate 14. The micro-devices are depicted generally by an area 16 on substrate 14. Micro-devices 16 represent generally one or more optical MEMS devices or other small optical, electrical, mechanical or electromechanical structures and devices. "Transparent" as used in this document means the property of transmitting electromagnetic radiation along at least that part of the spectrum that includes wavelengths of infrared, visible or ultra-violet light. For example, for a micro-device 16 used to modulate color in a digital projector, cover 12 will be transparent at least to visible light but need not be transparent to infrared and ultra-violet light. In another example, for a micro-device 16 used to generate or modulate light in an infrared laser, cover 12 will be transparent at least to infrared light but need not be transparent to visible and ultraviolet light.

As best seen in FIG. 3, a primary surface 18 on cover 12 is attached to a primary surface 20 on substrate 14 by a silicon bonding ring 22 that surrounds micro-devices 16. Micro-devices 16 are enclosed within a cavity 24 defined by cover 12, substrate 14 and bonding ring 22. Silicon bonding ring 22 formed on cover surface 18 bonds to substrate surface 20. Bonding ring 22 is bonded to substrate 14 along a bonding region 26 of substrate surface 20. While it is expected that bonding region 26 will usually be formed from a silicon oxide layer 28 deposited on substrate 14, any material suitable for bonding to silicon bonding ring 22 may be used. Electrical contact pads 32 are positioned along exposed periphery 30 of substrate 14 for making electrical contact to micro-devices 16 through a circuit structure (not shown) integrated into substrate 14.

Figure 4:
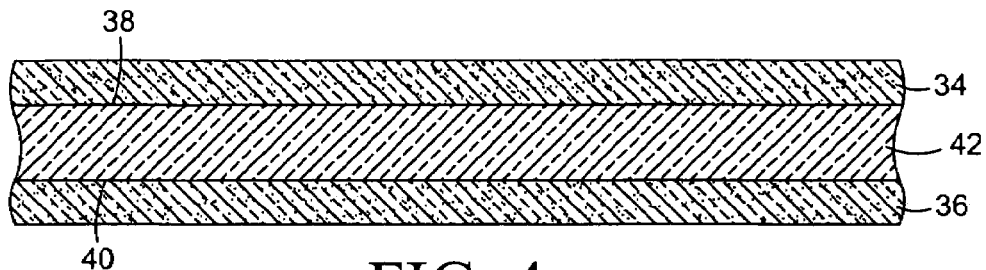
FIGS. 4-7 are section views illustrating a sequence of steps for processing the glass cover and assembling a micro-device package such as the one shown in FIG. 3.

FIGS. 4-7 are section views illustrating a sequence of steps for processing a glass cover wafer and assembling a MEMS device package such as package 10 shown in FIG. 3. Only a portion of the glass wafer is shown, at the location of an individual cover that is eventually singulated from the wafer as discussed below with reference to FIGS. 15 and 16. Referring first to FIG. 4, silicon layers 34 and 36 are formed on the top and bottom surfaces 38 and 40 of a glass wafer 42. Silicon layers 34 and 36 may be amorphous silicon or polysilicon. Although silicon layer 36 is the target layer (layer 34 being removed later), it is expected that wafer 42 will usually be processed as part of a batch of wafers. For batch processing glass wafers 42 to form silicon layer 36, in a chemical vapor deposition reactor for example, both surfaces 38 and 40 are exposed to the active media and, therefore, layers 34 and 36 are formed simultaneously.

Figure 5:
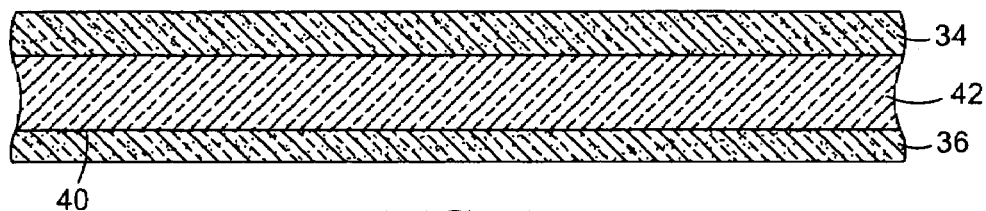
Figure 6:
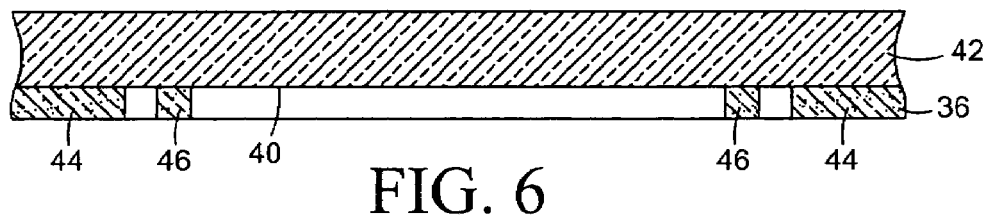
Figure 7:
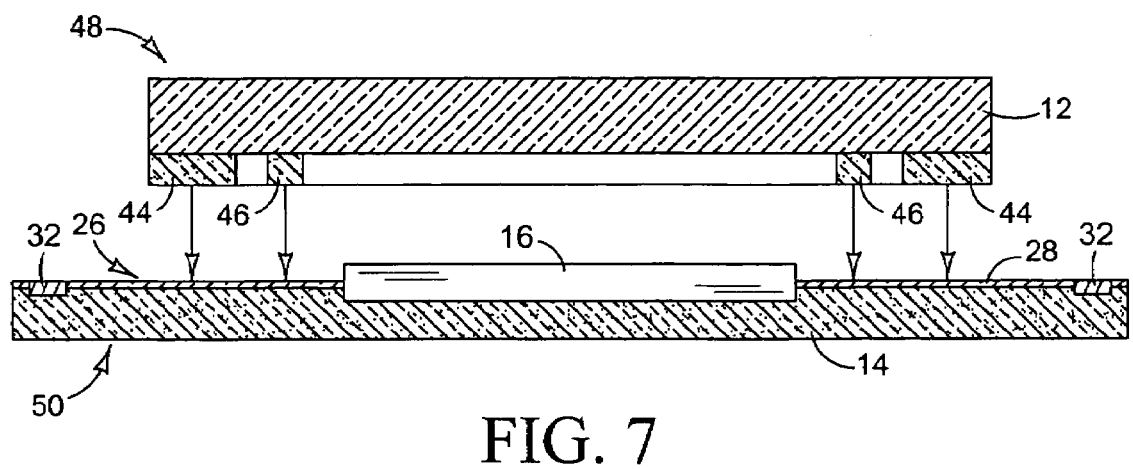

Referring to FIG. 5, silicon layer 36 on wafer bottom 40 may be planarized by, for example, chemical-mechanical polishing (CMP) at this point in the process to prepare the exposed surface of silicon layer 36 for subsequent bonding. The planarization is depicted in FIG. 4 by the thinner silicon layer 36 on wafer bottom 40. Referring to FIG. 6, silicon layers 34 and 36 are patterned and etched to remove silicon layer 34 from wafer top 38 and to form bonding ring 44 and alignment targets 46 on wafer bottom 40. FIG. 7 shows an individual cover 48 positioned over a silicon oxide bonding region 26 on a MEMS/substrate assembly 50. Bonding layer 44 and oxide layer 28 are "activated" by, for example, plasma treatment, bond and annealing process steps and then brought into contact to affix cover 48 to substrate assembly 50.

"Alignment target" as used in this document means a feature on a substrate or other structure that is visible to the processing equipment for aligning features during processing including, for example, aligning one mask level to another or aligning the substrate for bonding to another structure. In conventional optical MEMS processing, alignment targets are formed in a metal layer deposited on the glass or other transparent cover wafer and the bonding ring is formed in a separate layer of silicon oxide. In the embodiment described above, in which the alignment targets and the bonding ring are formed in the same layer of silicon, the number of overall processing steps is reduced compared to conventional processes by eliminating the metal deposition and etching steps while at the same time providing a stronger silicon to silicon oxide bond.

"Patterning and etching" as used in this document refers to the use of photolithographic masking and etching to form the desired components on a wafer or other substrate. This process consists of creating a photolithographic mask containing the pattern of the component to be formed, coating the wafer with a light-sensitive material called photoresist, exposing the photoresist coated wafer to light, typically ultra-violet light, through the mask to soften or harden parts of the photoresist (depending on whether positive or negative photoresist is used), removing the softened parts of the photoresist, etching to remove the materials left unprotected by the photoresist and stripping the remaining photoresist.

Figure 8:
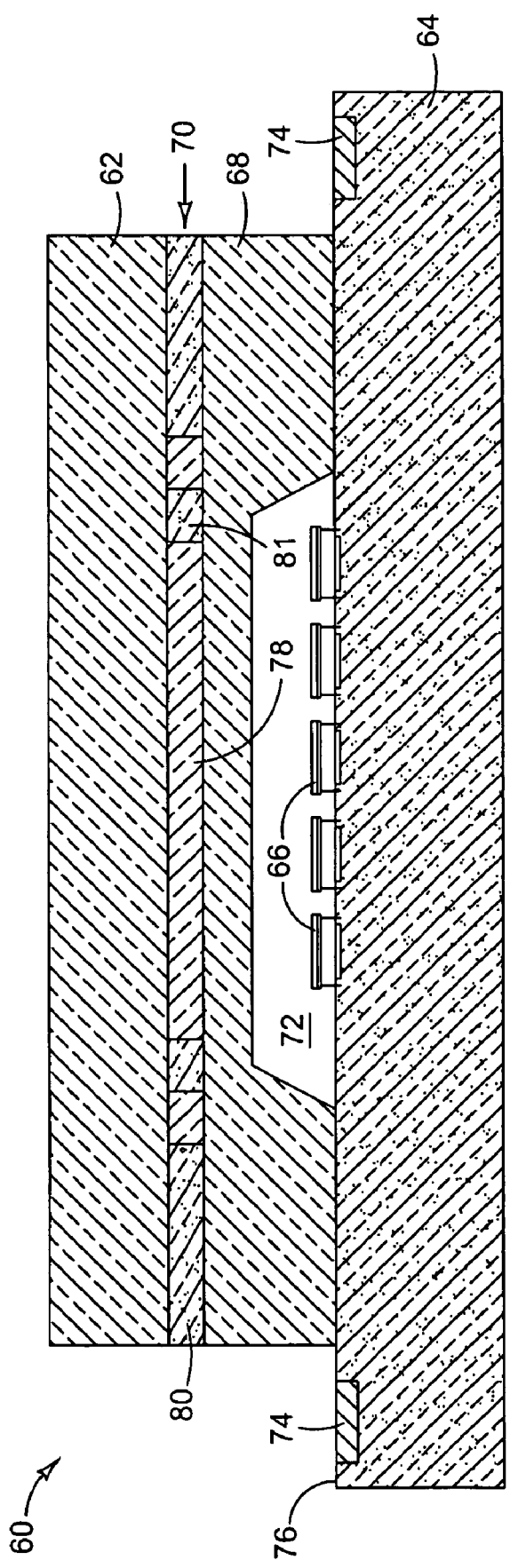
FIG. 8 is a section view illustrating an optical MEMS device package.

FIG. 8 is a section view illustrating an optical MEMS device package 60. FIGS. 9-14 are section views illustrating a sequence of steps for processing a glass cover wafer and assembling a MEMS device package such as package 60 shown in FIG. 8. Referring first to FIG. 8, device package 60 includes a glass or other transparent cover 62, a substrate 64 and an array of optical MEMS devices 66 formed on substrate 64. A separator 68 made from silicon oxide, silicon oxynitride, indium tin oxide (ITO) or another suitable transparent material is formed on substrate 64 over micro-devices 66. Cover 62 is bonded to separator 68 through a bonding layer 70. Devices 66 are enclosed within a cavity 72 defined by substrate 64 and separator 68. Electrical contact pads 74 are positioned along exposed periphery 76 of substrate 64 for making electrical contact to micro-devices 66 through a circuit structure (not shown) integrated into substrate 64.

Bonding layer 70 includes an inner transparent part 78 positioned over micro-devices 66 and an outer part 80 surrounding inner transparent part 78. A transparent inner part 78, made from silicon oxide or another suitable transparent bonding material for example, provides optical clarity at the viewing area over micro-devices 66 but a weaker bond, while a silicon outer part 80, for example, is opaque but provides a stronger bond outside the viewing area over micro-devices 66. An oxide inner part 78 is also desirable to minimize any disparity between the refractive indices of bonding layer 70 and separator 68 at the viewing area over micro-devices 66. Although a silicon outer part 80 formed using amorphous silicon or polysilicon is shown, any suitable bonding material that offers increased bond strength may be used for outer part 80. Silicon alignment targets 81 may also be left in bonding layer 70.

Figure 9:
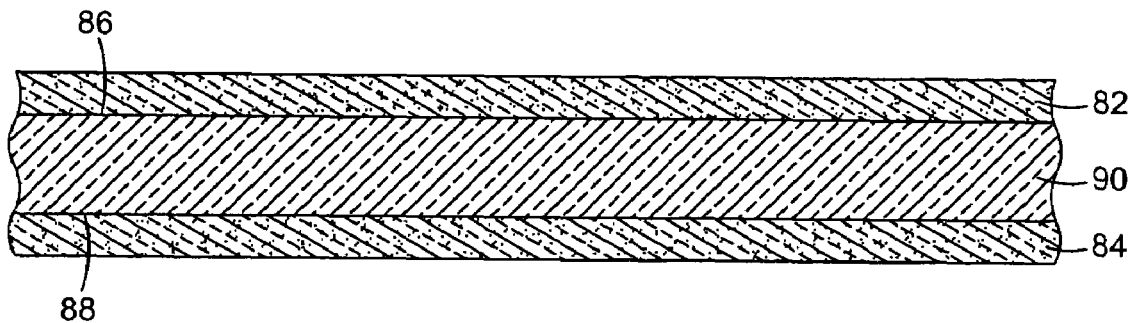
FIGS. 9-14 are section views illustrating a sequence of steps for processing the glass cover and assembling the MEMS device package shown in FIG. 8.
Figure 10:
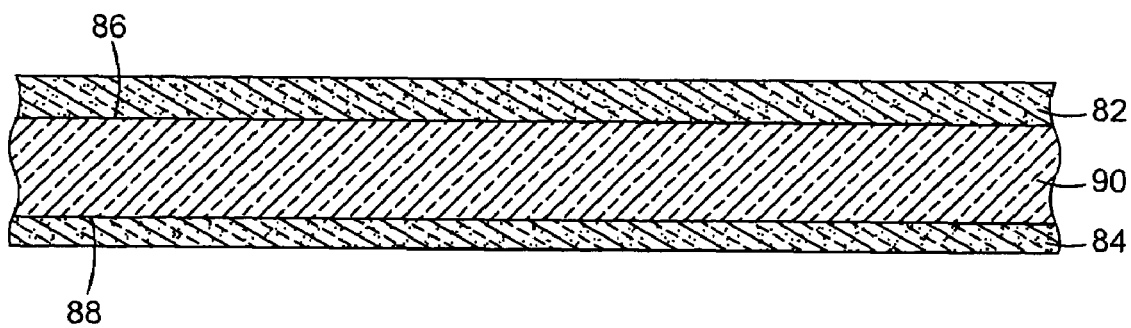
Figure 11:
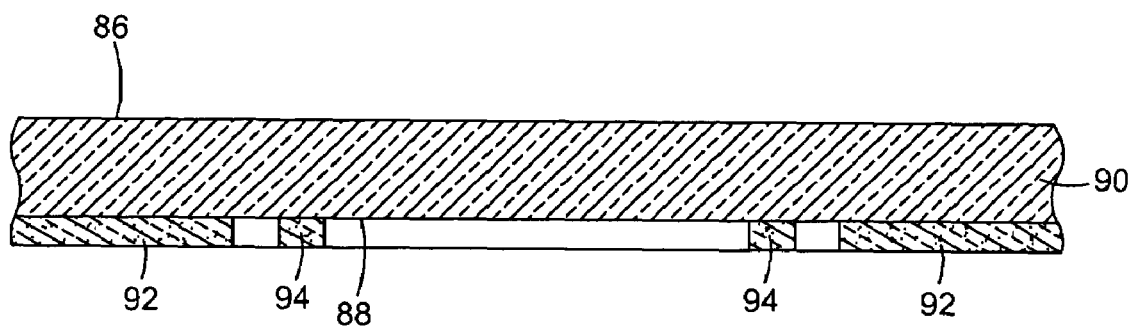

Referring now to FIG. 9, silicon layers 82 and 84 are formed on the top and bottom surfaces 86 and 88 of a glass wafer 90. Silicon layers 82 and 84 may be amorphous silicon or polysilicon. Referring to FIG. 10, silicon layer 84 of wafer bottom 88 may be planarized by, for example, chemical-mechanical polishing (CMP) at this point in the process to prepare the exposed surface of silicon layer 84 for subsequent bonding. The planarization is depicted in FIG. 10 by the thinner silicon layer 84 on wafer bottom 88. Referring to FIG. 11, silicon layers 82 and 84 are patterned and etched to remove silicon layer 82 from wafer top 86 and to form bonding ring 92 and alignment targets 94 on wafer bottom 88.

Figure 12:
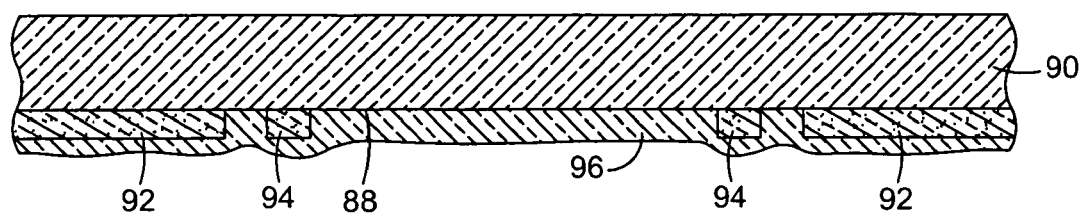
Figure 13:
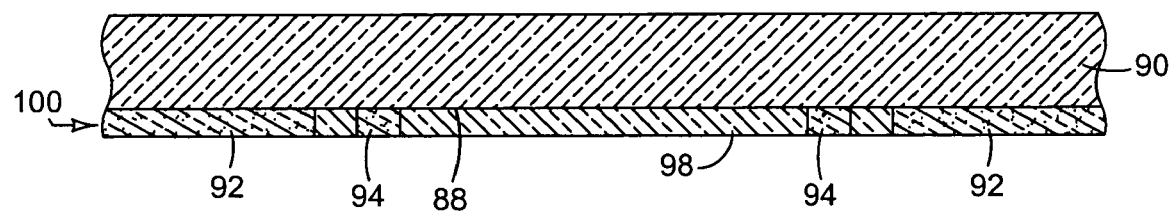
Figure 14:
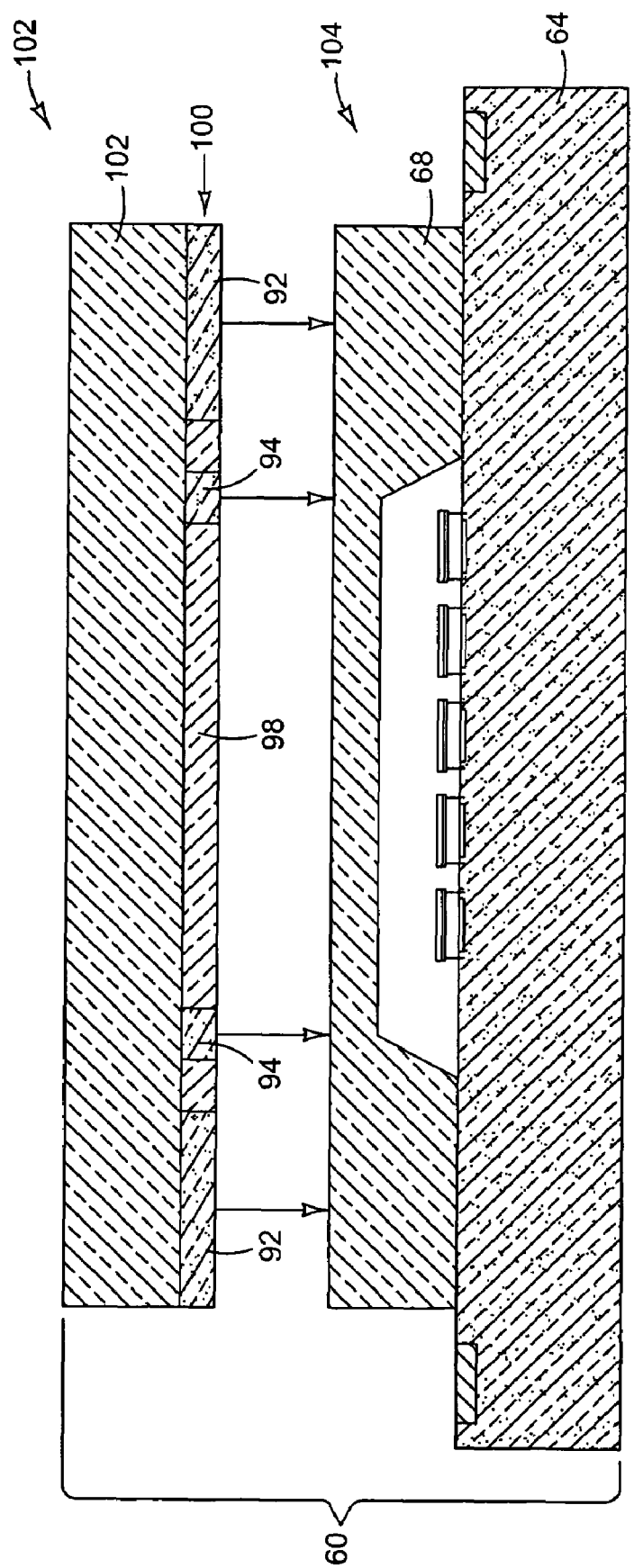

Next, and referring to FIG. 12, a silicon oxide layer 96 is formed over the wafer bottom 88 structure of FIG. 11. Oxide layer 96 is removed down to the level of silicon bonding ring 92 to form an inner part 98 of the two-part bonding layer 100 shown in FIG. 13. While it is expected that this oxide removal will usually be performed by chemical-mechanical polishing (CMP) or another suitable planarization technique, other removal techniques may be used. For example, excess oxide may be removed by patterning and etching or a combination of etching followed by CMP planarization. The planarization may include silicon bonding ring/outer part 92 to help ensure a truly planar surface across the full width of bonding layer 100. FIG. 14 shows an individual cover 102 positioned on separator 68 on a MEMS/substrate assembly 104. Bonding layer 100 and the surface of separator 68 are "activated" by, for example, plasma treatment, bond and annealing process steps and then brought into contact to affix cover 102 to separator 68.

Figure 15:
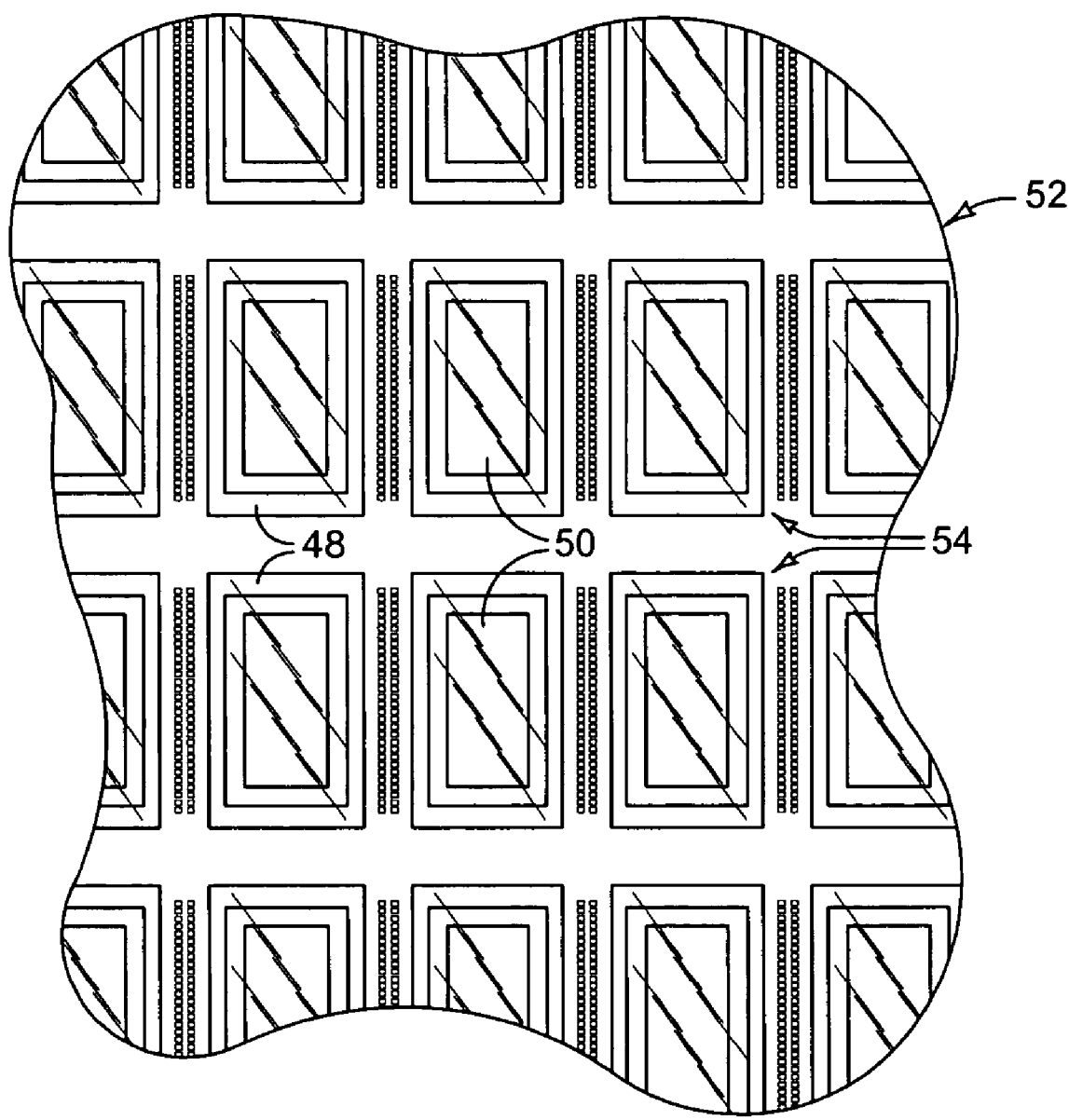
FIG. 15 is a plan view illustrating a portion of a wafer on which micro-device packages are assembled with individual covers.

FIG. 15 is a plan view illustrating a portion of a wafer 52 on which micro-device packages are assembled using a "pick and place" assembly technique. A silicon wafer 52, for example, forms the substrate for each device package. Multiple micro-device substrate assemblies 50 (shown) or 104 (not shown) are formed at die locations 54 on wafer 52. Each micro-device assembly 50 is formed on wafer 52 at a die location 54 configured to form individual dies when singulated from wafer 52. Each individual cover 48 (shown) or 102 (not shown) is "picked" and then "placed" over a device assembly 50 at a die location 54 and bonded to wafer 52 with a bonding ring or a bonding layer, as described above with reference to FIGS. 3 and 8.

Figure 16:
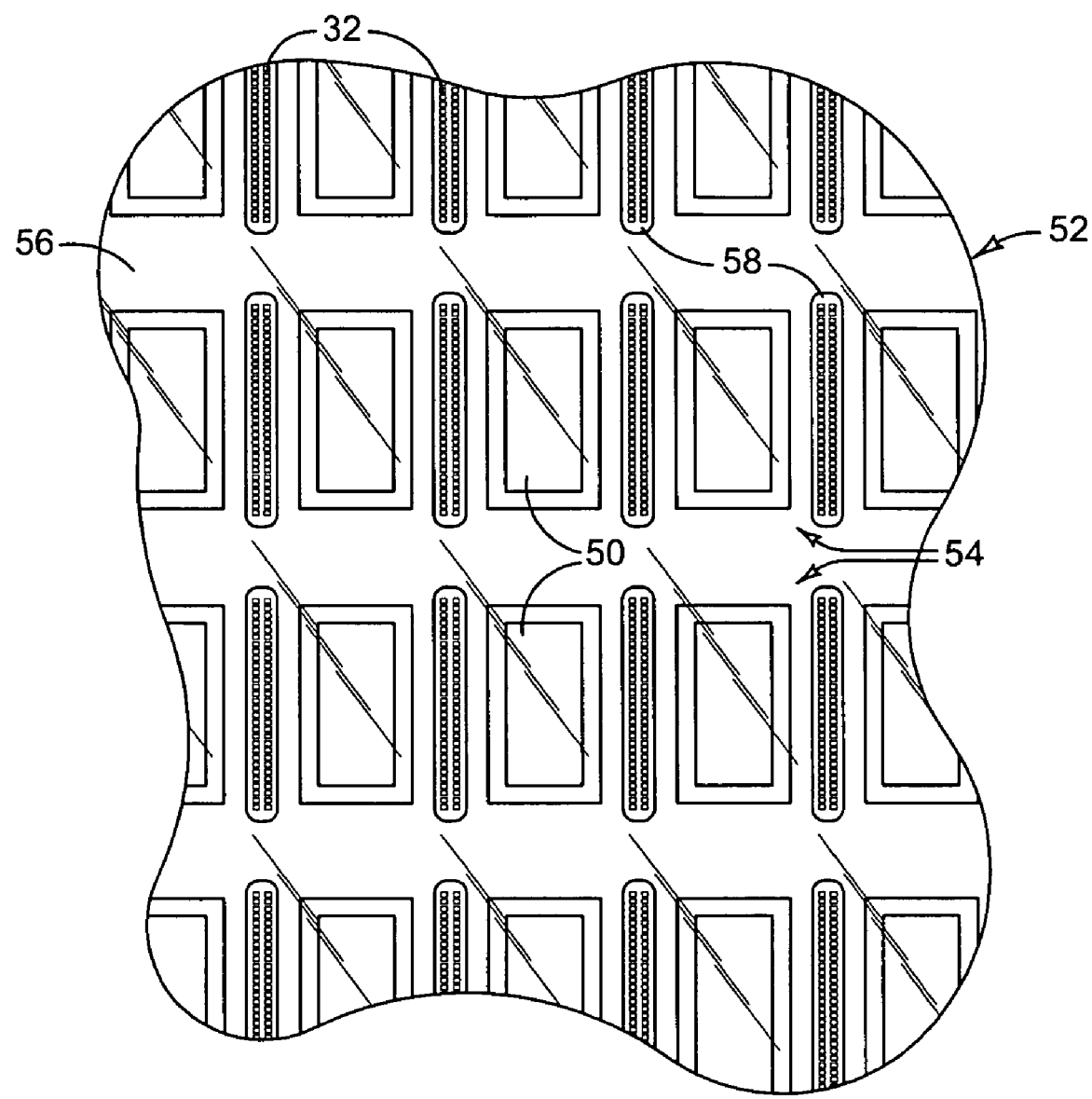
FIG. 16 is a plan view illustrating a portion of a wafer on which micro-device packages are assembled with a cover wafer.

FIG. 16 is a plan view illustrating the assembly of micro-device packages using a "wafer scale" assembly technique. Referring to FIG. 16, multiple micro-device assemblies 50 (shown) or 104 (not shown) are formed at die locations 54 on wafer 52. Each micro-device assembly 50 is formed on wafer 52 at a die location 54 configured to form individual dies when singulated from wafer 52. A transparent cover wafer 56 with openings 58 is bonded to wafer 52 at die locations 54 with a bonding ring or a bonding layer, as described above with reference to FIGS. 3 and 8. Each opening 58 is formed in transparent cover wafer 56 at a location corresponding to the location of adjacent rows of contact pads 32 on substrate wafer 52. The bonded wafer assembly may then be singulated into individual device packages/dies.

As noted at the beginning of this Description, the exemplary embodiments shown in the figures and described above illustrate but do not limit the invention. Other forms, details, and embodiments may be made and implemented. Therefore, the foregoing description should not be construed to limit the scope of the invention, which is defined in the following claims.

What is claimed is:

1. A method for making a cover for a micro-device package formed on a first substrate, the method for making the cover comprising forming a layer of silicon on a side of a transparent second substrate and selectively removing parts of the silicon layer to form a bonding ring and an alignment target on the side of the transparent second substrate each comprising a remaining part of the silicon layer, the bonding ring defining a cavity on the side of the transparent second substrate sized to accommodate the micro-device package when the cover is bonded to the first substrate.

2. The method of claim 1, wherein forming a layer of silicon comprises forming a layer of amorphous silicon or forming a layer of polysilicon.

3. The method of claim 1, wherein selectively removing parts of the silicon layer to form a bonding ring and an alignment target comprises selectively removing parts of the silicon layer to form a plurality of bonding rings and a plurality of alignment targets each comprising a remaining part of the silicon layer.

4. The method of claim 1, further comprising, after selectively removing parts of the silicon layer to form a bonding ring and an alignment target, forming a layer of transparent material over the side of the transparent second substrate and the bonding ring and the alignment target, and selectively removing parts of the transparent layer to a level of the bonding ring to expose a surface of the bonding ring and form a two part bonding layer having an inner transparent part comprising a remaining part of the transparent material surrounded by the bonding ring.

5. The method of claim 4, wherein the transparent material comprises a silicon oxide.

6. A method for making covers for a micro-device package, comprising:

simultaneously forming a first layer of silicon on a first side of a transparent wafer and a second layer of silicon on a second side of the transparent wafer;

removing the first silicon layer from the first side of the transparent wafer and selectively removing parts of the second silicon layer from the second side of the transparent wafer to form a plurality of silicon bonding rings each comprising a remaining part of the second silicon layer; and after selectively removing parts of the second silicon layer to form the silicon bonding rings, forming a layer of transparent material over the second side of the transparent wafer and the silicon bonding rings, and selectively removing parts of the transparent layer to a level of the silicon bonding rings to expose a surface of the silicon bonding rings and form a plurality of two part bonding layers each having an inner transparent part comprising a remaining part of the transparent material surrounded by a silicon bonding ring.

7. The method of claim 6, further comprising singulating the transparent wafer into individual covers each including a silicon bonding ring.

8. The method of claim 6, wherein the silicon comprises amorphous silicon or polysilicon.

9. The method of claim 6, further comprising selectively removing parts of the second silicon layer to form alignment targets simultaneously with selectively removing parts of the second silicon layer to form the silicon bonding rings, each of the alignment targets and each of the silicon bonding rings comprising a remaining part of the second silicon layer.

10. The method of claim 6, wherein the transparent material comprises a silicon oxide.

11. The method of claim 6, wherein removing the first silicon layer from the first side of the transparent wafer and selectively removing parts of the second silicon layer from the second side of the transparent wafer to form a plurality of silicon bonding rings comprises simultaneously removing the first silicon layer from the first side of the transparent wafer and selectively removing parts of the second silicon layer from the second side of the transparent wafer to form a plurality of silicon bonding rings.

12. A method for making micro-device packages, comprising:

forming a layer of silicon on a side of a transparent wafer;

selectively removing parts of the silicon layer to form a plurality of bonding rings and alignment targets on the side of the transparent wafer, each of the alignment targets and each of the bonding rings comprising a remaining part of the silicon layer;

singulating the transparent wafer into individual covers each including a bonding ring;

providing a plurality of micro-device assemblies each having a micro-device formed on a substrate;

covering each micro-device with one of the covers such that the bonding ring surrounds the micro-device, the bonding ring defining a cavity on the side of the transparent wafer sized to accommodate the micro-device when the one of the covers is bonded to the substrate; and bonding each cover to the substrate.

13. A method for making micro-device packages, comprising:

forming a layer of silicon on a side of a transparent first wafer;

selectively removing parts of the silicon layer to form a plurality of bonding rings and alignment targets on the side of the transparent first wafer, each of the alignment targets and each of the bonding rings comprising a remaining part of the silicon layer;

providing a second wafer having a plurality of micro-devices formed thereon;

positioning the transparent first wafer over the second wafer such that bonding rings on the transparent first wafer each surround a micro-device on the second wafer, each of the bonding rings defining a cavity on the side of the transparent first wafer sized to accommodate one of the micro-devices when the transparent first wafer is bonded to the second wafer;

bonding the transparent first wafer to the second wafer; and singulating the bonded wafers into individual micro-device packages.

14. A method for making a micro-device package, comprising:

simultaneously forming a first layer of silicon on a first side of a transparent first wafer and a second layer of silicon on a second side of the transparent first wafer;

removing the first silicon layer from the first side of the transparent first wafer and selectively removing parts of the second silicon layer from the second side of the transparent first wafer to form a plurality of bonding rings each comprising a remaining part of the second silicon layer;

providing a second wafer having a plurality of micro-devices formed thereon;

positioning the transparent first wafer over the second wafer such that bonding rings on the transparent first wafer each surround a micro-device on the second wafer, each of the bonding rings defining a cavity on the second side of the transparent first wafer sized to accommodate one of the micro-devices when the transparent first wafer is bonded to the second wafer;

bonding the transparent first wafer to the second wafer; and singulating the bonded wafers into individual micro-device packages.

15. The method of claim 14, further comprising selectively removing parts of the second silicon layer to form alignment targets simultaneously with selectively removing parts of the second silicon layer to form the bonding rings, each of the alignment targets and each of the bonding rings comprising a remaining part of the second silicon layer.

16. The method of claim 14, wherein removing the first silicon layer from the first side of the transparent first wafer and selectively removing parts of the second silicon layer from the second side of the transparent first wafer to form a plurality of bonding rings comprises simultaneously removing the first silicon layer from the first side of the transparent first wafer and selectively removing parts of the second silicon layer from the second side of the transparent first wafer to form a plurality of bonding rings.

17. A method for making a cover for a micro-device package, comprising:
   forming a layer of silicon on a side of a transparent substrate;
   selectively removing parts of the silicon layer to form a bonding ring comprising a remaining part of the silicon layer;
   forming a layer of transparent material over the side of the transparent substrate and the bonding ring; and
   selectively removing parts of the transparent layer to a level of the bonding ring to expose a surface of the bonding ring and form a two part bonding layer having an inner transparent part surrounded by the bonding ring.

18. The method of claim 17, wherein selectively removing parts of the silicon layer to form a bonding ring comprises selectively removing parts of the silicon layer to form a bonding ring and an alignment target each comprising a remaining part of the silicon layer.

* * * * *